United States Patent
Durukan et al.

(10) Patent No.: US 11,566,327 B2
(45) Date of Patent: Jan. 31, 2023

(54) METHODS AND APPARATUS TO REDUCE PRESSURE FLUCTUATIONS IN AN AMPOULE OF A CHEMICAL DELIVERY SYSTEM

(71) Applicant: Applied Materials, Inc., Santa Clara, CA (US)

(72) Inventors: Ilker Durukan, Los Gatos, CA (US); Muhammad M. Rasheed, San Jose, CA (US); Kenric Choi, San Jose, CA (US); Tatsuya Sato, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/100,249

(22) Filed: Nov. 20, 2020

(65) Prior Publication Data

US 2022/0162752 A1 May 26, 2022

(51) Int. Cl.
*C23C 16/40* (2006.01)
*C23C 16/455* (2006.01)

(52) U.S. Cl.
CPC .............. *C23C 16/45561* (2013.01)

(58) Field of Classification Search
CPC .............................................. C23C 16/45561
USPC ......... 118/715, 728, 50; 156/345.29, 345.33, 156/345.34, 345.35, 345.36, 345.26, 156/345.51
See application file for complete search history.

(56) References Cited

U.S. PATENT DOCUMENTS

| | | | |
|---|---|---|---|
| 5,465,746 A * | 11/1995 | Ebbing | F15B 11/0413 137/596.17 |
| 6,132,515 A * | 10/2000 | Gauthier | C23C 16/4481 118/726 |
| 6,464,948 B2 | 10/2002 | Honma | |
| 8,137,468 B2 | 3/2012 | Choi et al. | |
| 2004/0007180 A1 * | 1/2004 | Yamasaki | C23C 16/4481 118/715 |
| 2006/0021573 A1 * | 2/2006 | Monsma | C23C 16/44 118/715 |
| 2007/0235085 A1 * | 10/2007 | Nakashima | C23C 16/4408 137/240 |
| 2008/0041311 A1 | 2/2008 | Nakashima et al. | |
| 2008/0268143 A1 | 10/2008 | Vahlas et al. | |
| 2009/0325372 A1 * | 12/2009 | Harada | H01L 21/28088 257/E21.177 |

(Continued)

OTHER PUBLICATIONS

PCT International Seach Report and Written Opinion for PCT/US2021/060003 dated Mar. 8, 2022.

*Primary Examiner* — Rudy Zervigon
(74) *Attorney, Agent, or Firm* — Moser Taboada

(57) ABSTRACT

Methods and apparatus to reduce pressure fluctuations in a chemical delivery system for a process chamber are provided herein. In some embodiments, a chemical delivery system for a process chamber, includes: a carrier gas supply; an ampoule fluidly coupled to the carrier gas supply via a first supply line, wherein the ampoule is configured to supply one or more process gases to the process chamber via a second supply line; an inlet valve disposed in line with the first supply line to control a flow of a carrier gas from the carrier gas supply to the ampoule; and a first control valve disposed in line with a pressure regulation line, wherein the pressure regulation line is fluidly coupled to the first supply line at a tee location between the carrier gas supply and the inlet valve.

13 Claims, 3 Drawing Sheets

(56) References Cited

U.S. PATENT DOCUMENTS

| | | |
|---|---|---|
| 2010/0117246 A1 | 5/2010 | Sarigiannis et al. |
| 2010/0136230 A1 | 6/2010 | Moriya et al. |
| 2010/0219157 A1* | 9/2010 | Matsumoto ....... H01L 21/76873 |
| | | 216/37 |
| 2012/0288625 A1* | 11/2012 | Furuya .............. C23C 16/45557 |
| | | 118/725 |
| 2017/0096735 A1 | 4/2017 | Kumar et al. |
| 2017/0145564 A1 | 5/2017 | Bertuch et al. |

* cited by examiner

METHODS AND APPARATUS TO REDUCE PRESSURE FLUCTUATIONS IN AN AMPOULE OF A CHEMICAL DELIVERY SYSTEM

FIELD

Embodiments of the present disclosure generally relate to a substrate processing equipment, and more specifically, to chemical delivery systems of substrate processing equipment.

BACKGROUND

Substrate processing equipment may include solid chemical delivery systems to provide one or more process gases to a process chamber, for example, a chemical vapor deposition (CVD) chamber, an atomic layer deposition (ALD) chamber, an etch chamber, or the like, for performing a suitable chemical process. Solid chemical delivery systems typically include a sublimation vessel, or ampoule, that contains a solid-state precursor. A carrier gas may be flowed through the ampoule to sublime the solid-state precursor to form the one or more process gases to be delivered to the process chamber. However, when the carrier gas is introduced into the ampoule, an initial pressure spike may inadvertently cause the solid-state precursor to mix with the one or more process gases, causing solid-state precursor to contaminate the delivery lines from the ampoule to the process chamber.

Accordingly, the inventors have provided improved solid chemical delivery systems for reducing contamination.

SUMMARY

Methods and apparatus to reduce pressure fluctuations in a chemical delivery system for a process chamber are provided herein. In some embodiments, a chemical delivery system for a process chamber includes: a carrier gas supply; an ampoule fluidly coupled to the carrier gas supply via a first supply line, wherein the ampoule is configured to supply one or more process gases to the process chamber via a second supply line; an inlet valve disposed in line with the first supply line to control a flow of a carrier gas from the carrier gas supply to the ampoule; and a first control valve disposed in line with a pressure regulation line, wherein the pressure regulation line is fluidly coupled to the first supply line at a tee location between the carrier gas supply and the inlet valve.

In some embodiments, a chemical delivery system for a process chamber includes: a carrier gas supply; an ampoule fluidly coupled to the carrier gas supply via a first supply line, wherein the ampoule is configured to supply one or more process gases to the process chamber via a second supply line; a pressure switch disposed in line with the first supply line to control a pressure in the first supply line; an inlet valve disposed in line with the first supply line to control a flow of a carrier gas from the carrier gas supply to the ampoule; and a first control valve and a metering valve disposed in line with a pressure regulation line, wherein the pressure regulation line is fluidly coupled to the first supply line at a tee location between the carrier gas supply and the inlet valve, wherein a first length of the pressure regulation line extends from the first control valve to the tee location.

In some embodiments, a method of reducing pressure fluctuations in an ampoule for a process chamber includes: flowing a carrier gas from a carrier gas supply to a pressure regulation line via a first supply line, wherein the pressure regulation line diverts the flow of the carrier gas from the first supply line at a tee location; closing a first control valve disposed in line with the pressure regulation line; and opening an inlet valve disposed in line with the first supply line downstream of the tee location to flow the carrier gas to an ampoule.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
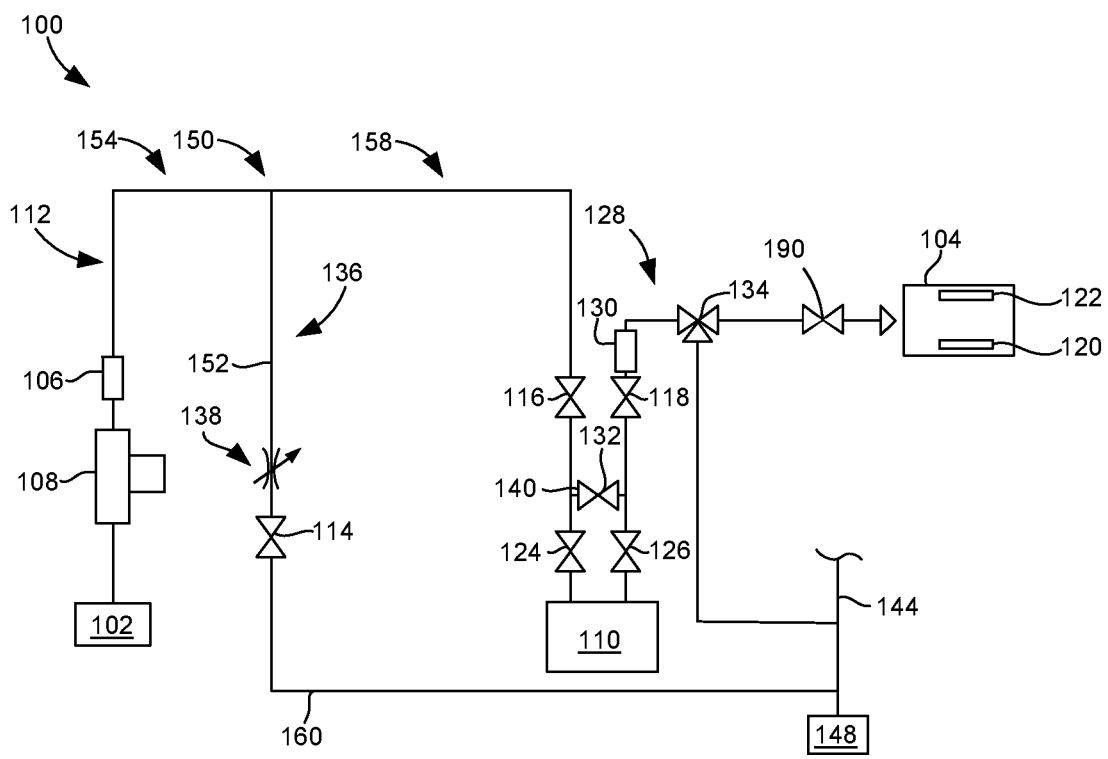
FIG. 1 is a schematic view of a chemical delivery system for a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus to reduce pressure fluctuations in a chemical delivery system for a process chamber are provided herein. The chemical delivery system includes a carrier gas supply to supply a carrier gas to an ampoule of the chemical delivery system via a first supply line. The carrier gas is configured to sublime a solid precursor that is disposed in the ampoule and form a mixture of the carrier gas and sublimed precursor as one or more process gases that are delivered from the ampoule to a process chamber via a second supply line. The solid chemical delivery system may be a delivery system for semiconductor substrate process chambers, for example, deposition chambers (CVD, ALD, or the like), etching chambers, cleaning chamber, or the like.

The chemical delivery system includes a pressure regulation line that extends from the first supply line upstream of the ampoule. The pressure regulation line advantageously stabilizes a pressure in the first supply line so that there is less pressure fluctuation in the ampoule when carrier gas is flowed into the ampoule. Less pressure fluctuation in the ampoule advantageously minimizes mixing of the solid precursor into the gaseous mixture of the on or more process gases, which consequently reduces solid precursor from contaminating the second supply line.

FIG. 1 is a schematic view of a chemical delivery system for a process chamber in accordance with at least some embodiments of the present disclosure. The chemical delivery system 100 includes a carrier gas supply 102. The carrier gas supply 102 may store a carrier gas, which in some embodiments can be a non-reactive gas. In some embodiments, the carrier gas may be one or more of argon gas, nitrogen gas, helium gas, hydrogen gas, or the like. The chemical delivery system 100 is configured to deliver the carrier gas from the carrier gas supply 102 to the process chamber 104. Other chemical delivery systems may have different elements and/or configurations, but the implementations discussed herein may still be applied to such other systems.

An ampoule 110 is fluidly coupled to the carrier gas supply 102 via a first supply line 112. The ampoule 110 may include a solid precursor that sublimes when the carrier gas is flowed into the ampoule 110 resulting in a gaseous mixture of the sublimed precursor and the carrier gas. The solid precursor may be any suitable precursor, for example but not limited to, a halide such as hafnium tetrachloride ($HfCl_4$). The ampoule 110 may be heated to encourage sublimation of the solid precursor. In some embodiments, the solid precursor is in granular form, comprising, for example, pellets or a powder. The ampoule 110 is configured to supply one or more process gases from the ampoule 110 to the process chamber 104 via a second supply line 128. The process chamber 104 may be any suitable chamber for processing a substrate 120 disposed therein. The process chamber 104 may include a gas distribution plate 122 having one or more openings for distributing the one or more process gases from the second supply line to the process chamber 104.

The first supply line 112 includes one or more control valves for controlling a flow or pressure of the carrier gas. For example, the first supply line 112 includes a mass flow controller 108 disposed downstream of the carrier gas supply 102 to control a mass flow of the carrier gas. In some embodiments, a pressure gauge 106 is disposed in line with the first supply line 112 to control a pressure in the first supply line 112. The pressure gauge 106 is disposed upstream of the ampoule 110. In some embodiments, the pressure gauge 106 is disposed downstream from the mass flow controller 108.

An inlet valve 116 disposed in line with the first supply line 112 to control a flow of the carrier gas from the carrier gas supply 102 to the ampoule 110. In some embodiments, an inlet isolation valve 124 is disposed in line with the first supply line 112 between the inlet valve 116 and the ampoule 110. In some embodiments, a bypass line 140 fluidly couples the first supply line 112 to the second supply line 128. In some embodiments, a bypass valve 132 is disposed in line with the bypass line 140 for flowing the carrier gas from the carrier gas supply 102 to the process chamber 104 without flowing through the ampoule 110. In some embodiments, the bypass line 140 is disposed between the inlet valve 116 and the inlet isolation valve 124. The inlet isolation valve 124 may generally be open. The inlet isolation valve 124 may be closed when flow through the bypass line 140 is desired.

A pressure regulation line 136 is fluidly coupled to the first supply line 112 at a tee location 150 disposed between the carrier gas supply 102 and the inlet valve 116. In some embodiments, an end of the pressure regulation line 136 opposite the tee location 150 is coupled to a foreline 144 of the chemical delivery system 100. The foreline 144 is coupled to a vacuum pump 148. A first control valve 114 is disposed in line with the pressure regulation line 136. The first control valve 114 is any suitable open/close valve having a fast response. The first control valve 114 having a fast response time (i.e., about 100 milliseconds or less) advantageously minimizes pressure fluctuations in the ampoule 110 when the first control valve 114 is closed and the inlet valve 116 and inlet isolation valve 124 are opened. In some embodiments, the first control valve 114 is an atomic layer deposition (ALD) valve commercially available from Swagelok® of Solon, Ohio.

In some embodiments, a metering valve 138 is disposed in line with the pressure regulation line 136. The metering valve 138 is generally a variable orifice valve to control a conductance in the pressure regulation line 136. The metering valve 138 may be disposed upstream or downstream of the first control valve 114. In some embodiments, the metering valve 138 may be a manual valve. In some embodiments, the first control valve 114 has a faster response time than the metering valve 138. In some embodiments, a fixed orifice valve may be used instead of the metering valve 138.

A first length 152 of the pressure regulation line 136 extends from the first control valve 114 to the tee location 150. In some embodiments, a second length 160 of the pressure regulation line 136 extends from the first control valve 114 to the foreline 144. A first portion 154 of the first supply line 112 extends from the pressure gauge 106 to the tee location 150. A second portion 158 of the first supply line 112 extends from the tee location 150 to the inlet valve 116. In some embodiments, the metering valve 138 is advantageously configured to match a conductance in the first length 152 of the pressure regulation line 136 to a conductance in the second portion 158 of the first supply line 112 to minimize pressure fluctuations in the ampoule 110 when flow of the carrier gas is switched from the pressure regulation line to the ampoule 110.

A conductance in each of the lines described herein may be a factor of a line length and number of bends. In some embodiments, the first portion 154 of the first supply line 112 is about 25.0 inches to about 35.0 inches long. In some embodiments, the first portion 154 has about 3 to about 8 bends. In some embodiments, the second portion 158 of the first supply line 112 is about 30.0 inches to about 40.0 inches long. In some embodiments, the second portion 158 has about 7 to about 15 bends. In some embodiments, the first length 152 has a length of about 28.0 inches to about 40.0 inches. In some embodiments, the first length 152 has about 5 to about 12 bends. In some embodiments, the first length 152 of the pressure regulation line 136 is longer than the first portion 154 of the first supply line 112. In some embodiments, a second portion 158 of the first supply line 112 is longer than the first portion 154 of the pressure regulation line 136. In some embodiments, a second portion 158 of the first supply line 112 includes more bends than the first length 152 of the pressure regulation line 136. In some embodiments, the second length 160 is about 10.0 inches to about 20.0 inches.

An outlet valve 118 is disposed in line with the second supply line 128 to control a flow of the one or more process gases to the process chamber 104. In some embodiments, an outlet isolation valve 126 is disposed in line with the second supply line 128 between the ampoule 110 and the outlet valve 118. The bypass line 140 may extend from the first supply line 112 to the second supply line 128 between the outlet valve 118 and the outlet isolation valve 126. The outlet isolation valve 126 may generally be open. The outlet isolation valve 126 may be closed when flow through the bypass line 140 is desired.

In some embodiments, a filter 130 is disposed in line with the second supply line 128. In some embodiments, the filter 130 is disposed downstream of the outlet valve 118. The filter 130 is generally configured to collect contaminants, for example, solid precursor, and prevent contaminants from entering the process chamber 104. In some embodiments, the filter 130 may filter particles that are about 5 nanometers or greater.

comprising a vacuum valve disposed in line with the second supply line, wherein the vacuum valve is a same type of valve as the first control valve.

In some embodiments, a vacuum valve 134 is disposed in line with the second supply line 128 downstream of the ampoule 110. The vacuum valve 134 is coupled to the foreline 144 to selectively evacuate the second supply line 128. In some embodiments, the vacuum valve 134 is a same type of valve as the first control valve 114. The vacuum valve 134 is advantageously a fast response valve to minimize pressure fluctuations in the ampoule when the vacuum valve 134 switches flow to the process chamber 104 to the foreline 144.

In some embodiments, a second control valve 190 is disposed between the outlet valve 118 and the process chamber 104. The second control valve 190 is generally a fast response valve so that flow of the one or more process gases therethrough may controlled accurately. In some embodiments, the second control valve 190 is configured to pulse the one or more process gases to the process chamber 104. The second control valve 190 may be a same type of valve as at least one of the vacuum valve 134 or the first control valve 114. In some embodiments, the second control valve 190 is disposed between the vacuum valve 134 and the process chamber 104.

Figure 2A:
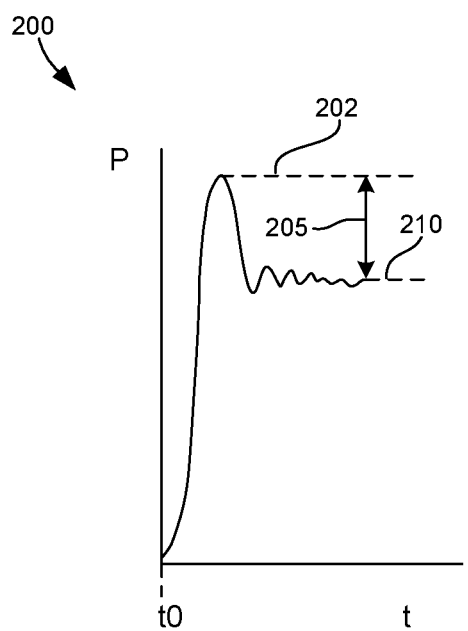
FIG. 2A depicts a pressure versus time graph of ampoule pressure in accordance with at least some embodiments of the present disclosure.

FIG. 2A depicts a pressure versus time graph 200 of ampoule pressure in accordance with at least some embodiments of the present disclosure. FIG. 2A depicts an exemplary pressure versus time graph for a chemical delivery system that does not include a pressure regulation line (i.e., pressure regulation line 136). At $t_o$, the inlet valve 116 is opened and carrier gas is flowed into the ampoule 110. Without the pressure regulation line 136, a pressure in the ampoule 110 may go up to a peak pressure 202 before settling down to a mean pressure 210. A first pressure difference 205 is a difference in pressure between the peak pressure 202 and the mean pressure 210.

Figure 2B:
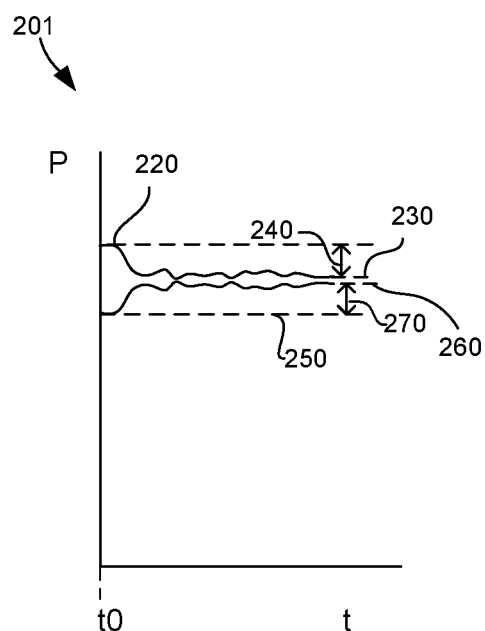
FIG. 2B depicts a pressure versus time graph of ampoule pressure in accordance with at least some embodiments of the present disclosure.

FIG. 2B depicts a pressure versus time graph 201 of ampoule pressure in accordance with at least some embodiments of the present disclosure. FIG. 2B depicts an exemplary pressure versus time graph for the chemical delivery system 100 that includes the pressure regulation line 136. At $t_o$, the inlet valve 116 is opened and carrier gas is flowed into the ampoule 110. Pressure in the ampoule 110 may start at a peak pressure 220 before settling down to a mean pressure 230. A second pressure difference 240 is a difference in pressure between the peak pressure 220 and the mean pressure 230. Alternatively, pressure in the ampoule 110 may start at an initial lower pressure 250 and go up to a mean pressure 260. A third pressure difference 270 is a difference in pressure between the mean pressure 260 and the initial lower pressure 250.

With the pressure regulation line 136, a pressure in the first supply line 112 downstream of the inlet valve 116 is closer to the mean pressure 260 and mean pressure 260, causing the pressure in the ampoule 110 to stabilize more quickly and have less pressure fluctuations. The second pressure difference 240 and the third pressure difference 270 are advantageously less than the first pressure difference 205, leading to less contamination in the second supply line 128.

Figure 3:
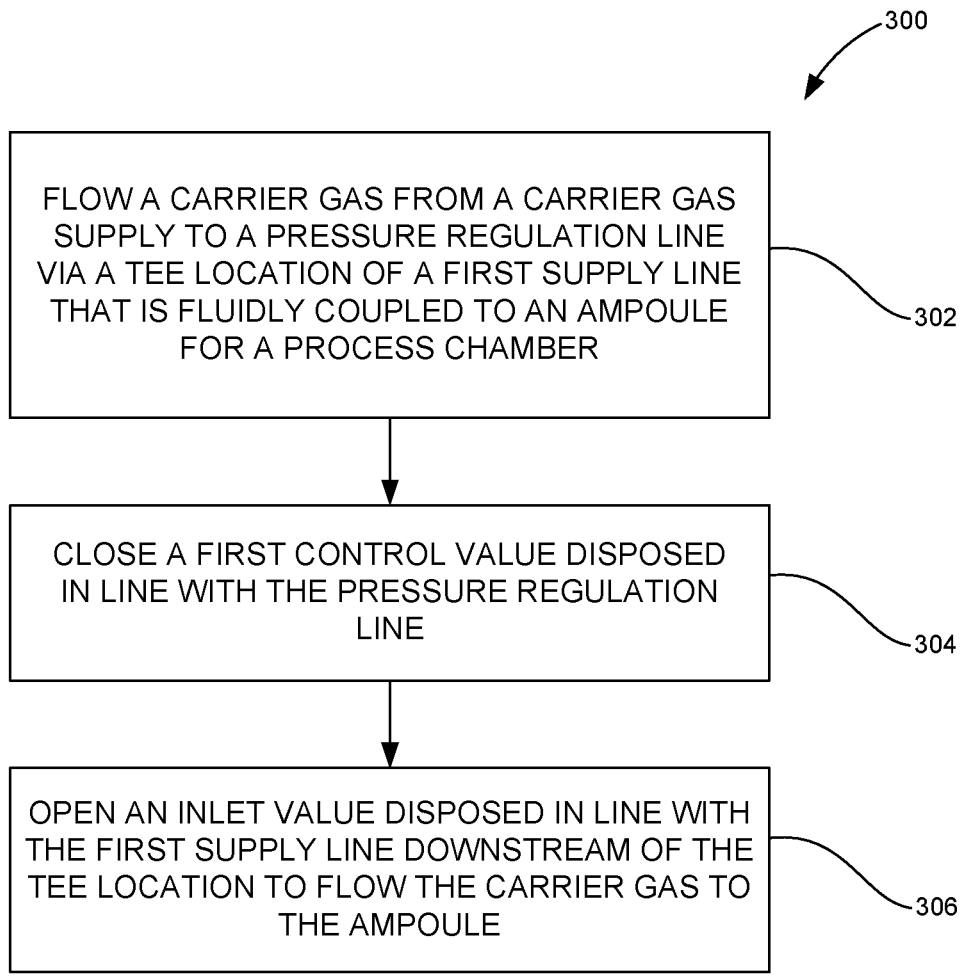
FIG. 3 depicts a flow chart of a method of reducing pressure fluctuations in an ampoule for a process chamber.

FIG. 3 depicts a flow chart of a method 300 of reducing pressure fluctuations in an ampoule (i.e., ampoule 110) for a process chamber (i.e., process chamber 104). At 302, the method 300 includes flowing a carrier gas from a carrier gas supply (i.e., carrier gas supply 102) to a pressure regulation line (i.e., pressure regulation line 136) via a first supply line (i.e., first supply line 112), wherein the pressure regulation line diverts the flow of the carrier gas from the first supply line at a tee location (i.e., tee location 150). The pressure regulation line includes at least one of a metering valve (i.e., metering valve 138) or a first control valve (i.e., first control valve 114). The pressure regulation line may be coupled to a foreline (i.e., foreline 144).

At 304, the first control valve disposed in line with the pressure regulation line is closed. In some embodiments, a pressure in the pressure regulation line is regulated via the metering valve prior to closing the first control valve. In some embodiments, the pressure in the pressure regulation line is set to about 50 torr to about 200 torr. In some embodiments, the response time of the first control valve is less than about 100 milliseconds.

At 306, an inlet valve (i.e., inlet valve 116) disposed in line with the first supply line downstream of the tee location to flow the carrier gas to the ampoule is opened. In some embodiments, after opening the inlet valve, the ampoule is pressurized to about 50 torr to about 200 torr. In some embodiments, the first control valve is closed simultaneously with opening the inlet valve to advantageously reduce pressure fluctuations in the ampoule.

In some embodiments, one or more process gases comprising the carrier gas or a mixture of the carrier gas and any other gases in the ampoule are flowed from the ampoule to the process chamber via a second supply line (i.e., second supply line 128). In some embodiments, the one or more process gases includes a mixture of the carrier gas and sublimed material of a solid precursor disposed in the ampoule. In some embodiments, the one or more process gases are filtered in the second supply line via a filter (i.e., filter 130) to restrict particles that are about 5.0 nanometers or smaller. In some embodiments, the second supply line may be purged via a vacuum valve (i.e., vacuum valve 134).

While the foregoing is directed to embodiments of the present disclosure, other and further embodiments of the disclosure may be devised without departing from the basic scope thereof.

The invention claimed is:

1. A chemical delivery system for a process chamber, comprising:
   a carrier gas supply;
   an ampoule fluidly coupled to the carrier gas supply via a first supply line, wherein the ampoule is configured to supply one or more process gases to the process chamber via a second supply line;
   an inlet valve disposed in line with the first supply line to control a flow of a carrier gas from the carrier gas supply to the ampoule; and
   a first control valve disposed in line with a pressure regulation line, wherein the pressure regulation line is fluidly coupled to the first supply line at a tee location between the carrier gas supply and the inlet valve, wherein the tee location is disposed upstream of the inlet valve.

2. The chemical delivery system of claim 1, wherein the pressure regulation line includes a metering valve.

3. The chemical delivery system of claim 1, further comprising a vacuum valve disposed in the second supply line, wherein the vacuum valve is a fast response valve having a response time of about 100 milliseconds or less.

4. The chemical delivery system of claim 1, further comprising an outlet valve disposed in line with the second supply line to control a flow of the one or more process gases to the process chamber.

5. The chemical delivery system of claim 4, further comprising an inlet isolation valve disposed in line with the first supply line between the inlet valve and the ampoule, and an outlet isolation valve disposed in line with the second supply line between the ampoule and the outlet valve.

6. The chemical delivery system of claim 4, further comprising a filter disposed in line with the second supply line.

7. The chemical delivery system of claim 6, wherein the filter is disposed downstream of the outlet valve.

8. The chemical delivery system of claim 1, further comprising a bypass line that fluidly couples the first supply line to the second supply line, and a bypass valve disposed in line with the bypass line.

9. The chemical delivery system of claim 2, wherein the pressure regulation line extends from the tee location to the metering valve to a foreline.

10. A chemical delivery system for a process chamber, comprising:
   a carrier gas supply;
   an ampoule fluidly coupled to the carrier gas supply via a first supply line, wherein the ampoule is configured to supply one or more process gases to the process chamber via a second supply line;
   a pressure gauge disposed in the first supply line to control a pressure in the first supply line;
   an inlet valve disposed in line with the first supply line to control a flow of a carrier gas from the carrier gas supply to the ampoule; and
   a first control valve and a metering valve disposed in line with a pressure regulation line, wherein the pressure regulation line is fluidly coupled to the first supply line at a tee location between the carrier gas supply and the inlet valve, wherein a first length of the pressure regulation line extends from the first control valve to the tee location, and wherein the tee location is disposed upstream of the inlet valve.

11. The chemical delivery system of claim 10, wherein the first length of the pressure regulation line is longer than a first portion of the first supply line from the pressure gauge to the tee location.

12. The chemical delivery system of claim 11, wherein a second portion of the first supply line from the tee location to the inlet valve is greater than the first length of the pressure regulation line.

13. The chemical delivery system of claim 12, wherein the second portion of the first supply line includes more bends than the first length of the pressure regulation line.

* * * * *